(12) United States Patent
Hwang et al.

(10) Patent No.: US 9,735,039 B2
(45) Date of Patent: Aug. 15, 2017

(54) APPARATUS FOR SEPARATING WAFER FROM CARRIER

(71) Applicant: TAIWAN SEMICONDUCTOR MANUFACTURING COMPANY, LTD., Hsinchu (TW)

(72) Inventors: Chien Ling Hwang, Hsinchu (TW); Lin-Wei Wang, Zhubei (TW); Chung-Shi Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 87 days.

(21) Appl. No.: 14/465,185

(22) Filed: Aug. 21, 2014

(65) Prior Publication Data

US 2014/0360671 A1    Dec. 11, 2014

Related U.S. Application Data

(62) Division of application No. 13/427,724, filed on Mar. 22, 2012, now Pat. No. 8,834,662.

(51) Int. Cl.
*B32B 43/00* (2006.01)
*B32B 38/10* (2006.01)
(Continued)

(52) U.S. Cl.
CPC ...... *H01L 21/6836* (2013.01); *B32B 37/0046* (2013.01); *B32B 37/06* (2013.01); *B32B 37/16* (2013.01); *B32B 38/10* (2013.01); *B32B 38/18* (2013.01); *B32B 38/1858* (2013.01); *B32B 39/00* (2013.01); *B32B 41/00* (2013.01); *B32B 43/006* (2013.01); *H01L 21/67092* (2013.01); *H01L 21/68* (2013.01);
(Continued)

(58) Field of Classification Search
CPC ............ B32B 43/006; Y10T 156/1132; Y10T 156/1153; Y10T 156/1168; Y10T 156/1911; Y10T 156/1944; Y10T 156/1978; Y10S 156/93; Y10S 156/941
See application file for complete search history.

(56) References Cited

U.S. PATENT DOCUMENTS 5,256,599 A    10/1993   Asetta et al.
5,447,596 A    9/1995    Hayase
(Continued)

FOREIGN PATENT DOCUMENTS

JP         2005191078 A    *   7/2005

OTHER PUBLICATIONS

Machine Translation of JP 2005-191078 A, Jul. 2005.*

*Primary Examiner* — Mark A Osele
(74) *Attorney, Agent, or Firm* — Hauptman Ham, LLP (57) ABSTRACT

An apparatus for separating a wafer from a carrier includes a platform having an upper surface, a tape feeding unit, a first robot arm, and a controller coupled to the platform. The controller is configured to mount a wafer frame, by using the tape feeding unit, on a wafer of a wafer assembly on the upper surface of the platform. The wafer assembly includes the wafer, a carrier, and a layer of wax between the wafer and the carrier. The controller is also configured to heat the upper surface of the platform to a predetermined temperature and separate, by the first robot arm, the wafer and the wafer frame mounted thereon from the carrier.

20 Claims, 7 Drawing Sheets

(51) Int. Cl.
*H01L 21/683* (2006.01)
*H01L 21/67* (2006.01)
*B32B 37/00* (2006.01)
*B32B 37/06* (2006.01)
*B32B 37/16* (2006.01)
*B32B 38/18* (2006.01)
*B32B 39/00* (2006.01)
*B32B 41/00* (2006.01)
*H01L 21/68* (2006.01)
*H01L 21/687* (2006.01)
*H01L 23/544* (2006.01)

(52) U.S. Cl.
CPC .... *H01L 21/6835* (2013.01); *H01L 21/68764* (2013.01); *B32B 2038/1891* (2013.01); *B32B 2041/04* (2013.01); *B32B 2307/202* (2013.01); *B32B 2309/02* (2013.01); *B32B 2457/14* (2013.01); *H01L 21/67109* (2013.01); *H01L 21/67132* (2013.01); *H01L 21/6831* (2013.01); *H01L 21/6838* (2013.01); *H01L 23/544* (2013.01); *H01L 2221/6834* (2013.01); *H01L 2221/68327* (2013.01); *H01L 2221/68381* (2013.01); *H01L 2223/54493* (2013.01); *H01L 2924/0002* (2013.01); *Y10S 156/93* (2013.01); *Y10S 156/941* (2013.01); *Y10T 156/1132* (2015.01); *Y10T 156/1153* (2015.01); *Y10T 156/1168* (2015.01); *Y10T 156/12* (2015.01); *Y10T 156/14* (2015.01); *Y10T 156/15* (2015.01); *Y10T 156/1911* (2015.01); *Y10T 156/1944* (2015.01); *Y10T 156/1978* (2015.01)

(56) References Cited

U.S. PATENT DOCUMENTS

| | | | |
|---|---|---|---|
| 5,476,566 A | 12/1995 | Cavasin | |
| 5,494,549 A * | 2/1996 | Oki | B28D 5/0082 156/268 |
| 6,479,386 B1 | 11/2002 | Ng et al. | |
| 6,569,282 B1 * | 5/2003 | Arisa | H01L 21/6708 156/345.21 |
| 6,863,590 B2 * | 3/2005 | Kobayashi | B24B 37/345 451/287 |
| 7,118,645 B2 * | 10/2006 | Yamamoto | B26F 1/3846 156/270 |
| 7,393,757 B2 * | 7/2008 | Miyamoto | B32B 43/006 438/460 |
| 7,767,551 B2 * | 8/2010 | Arita | H01L 21/78 438/460 |
| 7,833,367 B2 * | 11/2010 | Yamamoto | B26D 7/26 156/350 |
| 8,110,058 B2 * | 2/2012 | Kaneshima | B29C 63/02 156/228 |
| 8,142,595 B2 * | 3/2012 | Kobayashi | H01L 21/67132 156/247 |
| 8,894,807 B2 * | 11/2014 | Lindner | H01L 21/6835 156/703 |
| 2012/0028438 A1 | 2/2012 | Richter | |
| 2012/0160397 A1 | 6/2012 | Yamamoto et al. | |

\* cited by examiner

APPARATUS FOR SEPARATING WAFER FROM CARRIER

PRIORITY CLAIM

The present application is a divisional of U.S. application Ser. No. 13/427,724, filed Mar. 22, 2012, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits formed on larger wafers than the previous generation. Technologies, such as three-dimensional integrated circuits (3D ICs) and through silicon vias (TSVs), are also used to further decrease the number and length of interconnections between electrical components formed on the ICs as the number of electrical components increases. In some applications, the 3D IC and TSV technologies include performing a backside thinning (or grinding) process to a wafer for obtaining thinner chips or dies. This is accomplished by mounting a front side of the wafer to a carrier and then removing a predetermined amount of material from the back side of the wafer after the electrical components for the circuit and/or TSVs have been fabricated on the front side of the wafer.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
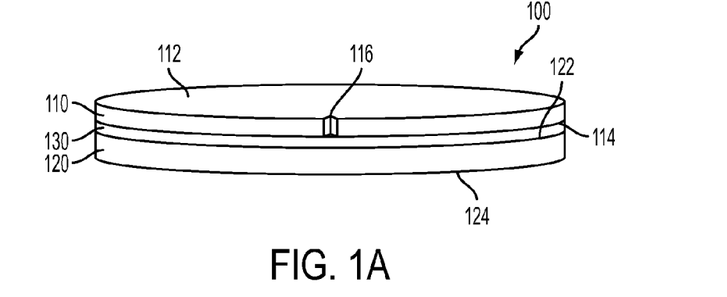
FIG. 1A is a perspective view of a wafer assembly in accordance with one or more embodiments.

FIG. 1A is a perspective view of a wafer assembly 100 in accordance with one or more embodiments. The wafer assembly 100 includes a wafer 110, a carrier 120, and a layer of wax 130 between the wafer 110 and the carrier 120. The wafer 110 has an upper surface 112, a lower surface 114, and a cut mark 116 (such as a V-shape notch) that is usable to identify an orientation of the wafer 110. In some embodiments, the cut mark 116 is also usable to identify a material used to form a substrate of the wafer 110. The carrier 120 has an upper surface 122 and a lower surface 124. The upper surface 122 of the carrier 120 and the lower surface 114 of the wafer 110 sandwich and are bonded together by the layer of wax 130. In at least one embodiment, the wafer assembly 100 is usable for performing a back side grinding process on the wafer 110.

In some embodiments, the wafer 110 is a semiconductor wafer having a semiconductor substrate and a plurality of electrical components formed on a front side of the substrate. In at least one embodiment for performing a back side grinding process on a back side of the substrate, the lower surface 114 of the wafer 110 corresponds to the front side of the substrate, and the upper surface 112 of the wafer 110 corresponds to the back side of the substrate. In some embodiments, the wafer 110 has a thickness ranging from 10 μm to 200 μm. In some embodiments, the wafer 110 has a diameter greater than 100 mm. In at least one embodiment, the wafer 110 has a diameter of 450 mm.

In some embodiments, the carrier 120 comprises a material including silicon, metal, or glass. In some embodiments, a thickness of the carrier 120 ranges from 700 μm to 1000 μm. In at least one embodiment, the carrier 120 maintains an overall rigidity and an overall thickness of the wafer assembly 100 when performing the back side grinding process on the wafer 110. By maintaining the rigidity and thickness of the wafer assembly 100, the risks of warpage and cracking of the wafer 110 caused during the back side grinding process and the transportation of the wafer 110 before, during, and after the back side grinding process decrease. In some embodiments, the carrier 120 has a size and shape substantially the same as the wafer 110.

In some embodiments, the layer of wax 130 is capable of retaining the wafer 110 to the carrier 120 during the back side grinding process. In some embodiments, the wax material of the layer of wax 130, at a temperature less than a threshold temperature, is in solid state or in liquid state having a viscosity coefficient greater than a predetermined value at least sufficient to withstand the torque caused during the back side grinding process. In some embodiments, the wax material of the layer of wax 130, at a temperature equal to or greater than the threshold temperature, is in liquid state having a viscosity coefficient equal to or less than the predetermined value. In some embodiments, the threshold temperature ranges from 100° C. to 120° C. In some embodiments, a thickness of the layer of wax 130 ranges from 3 µm to 5 µm.

Figure 1B:
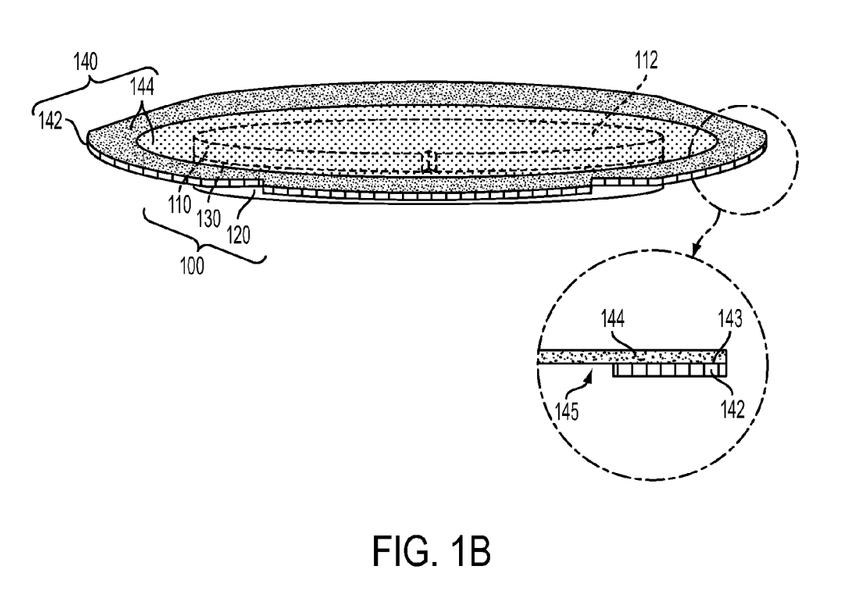
FIG. 1B is a perspective view of a wafer assembly and a wafer frame mounted thereon, and an enlarged cross-sectional partial view of the wafer frame in accordance with one or more embodiments.

FIG. 1B is a perspective view of the wafer assembly 100 and a wafer frame 140 mounted thereon and an enlarged cross-sectional partial view of the wafer frame 140 taken at plane A in accordance with one or more embodiments. The wafer assembly 100 having the wafer frame 140 mounted thereon is usable as an intermediate product before separating the wafer 110 from the carrier 120.

The wafer frame 140 is mounted on the upper surface 112 of the wafer 110. The wafer frame 140 includes a ring shape frame 142 and a tape 144. The ring shape frame 142 has an upper surface 143, and the tape 144 is attached to the upper surface 112 of the wafer 110 and the upper surface 143 of the ring shape frame 142. The ring shape frame 142 has a hollow region 145 defined therein. The tape 144 extends over the hollow region 145 and has an adhesive material that binds the wafer 110, the tape 144, and the ring shape frame 142 as one piece.

In some embodiments, the ring shape frame 142 has any size and shape. In at least one embodiment, the ring shape frame 142 defines a circular hollow region 145 having an area larger than an area of the wafer 110. In some embodiments, the ring shape frame 142 has a shape that fits a container used to transport the ring shape frame 142. In some embodiments, the ring shape frame 142 comprises a plastic material. In some embodiments, the ring shape frame 142 comprises a metallic material including stainless steel, which is more rigid and less vulnerable to corrosion than using a plastic material. In some embodiments, the ring shape frame 142 has a thickness ranging from 0.7 mm to 1.6 mm.

In some embodiments, the adhesive material of the tape 144 is releasable under electromagnetic radiation of a predetermined wavelength. In at least one embodiment, the predetermined wavelength is within an ultraviolet spectrum. In some embodiments, "ultraviolet spectrum" refers to electromagnetic radiation having a wavelength ranging from 10 nm to 400 nm.

Figure 1C:
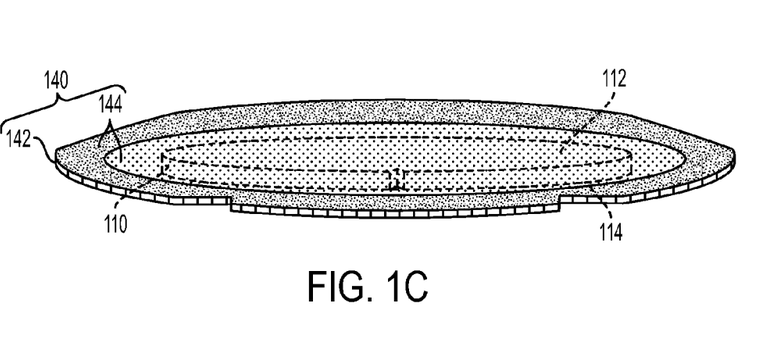
FIG. 1C is a perspective view of a wafer separated from a carrier in accordance with one or more embodiments.

FIG. 1C is a perspective view of the wafer 110 already separated from the carrier 120 (FIG. 1A and FIG. 1B) in accordance with one or more embodiments. After the separation of the wafer 110 and the carrier 120, the wafer frame 140 is usable for supporting and transporting the wafer 110. By mounting the wafer frame 140 to the wafer 110, the risks of warpage and cracking of the wafer 110 caused during transport of the wafer 110 decrease.

Figure 2:
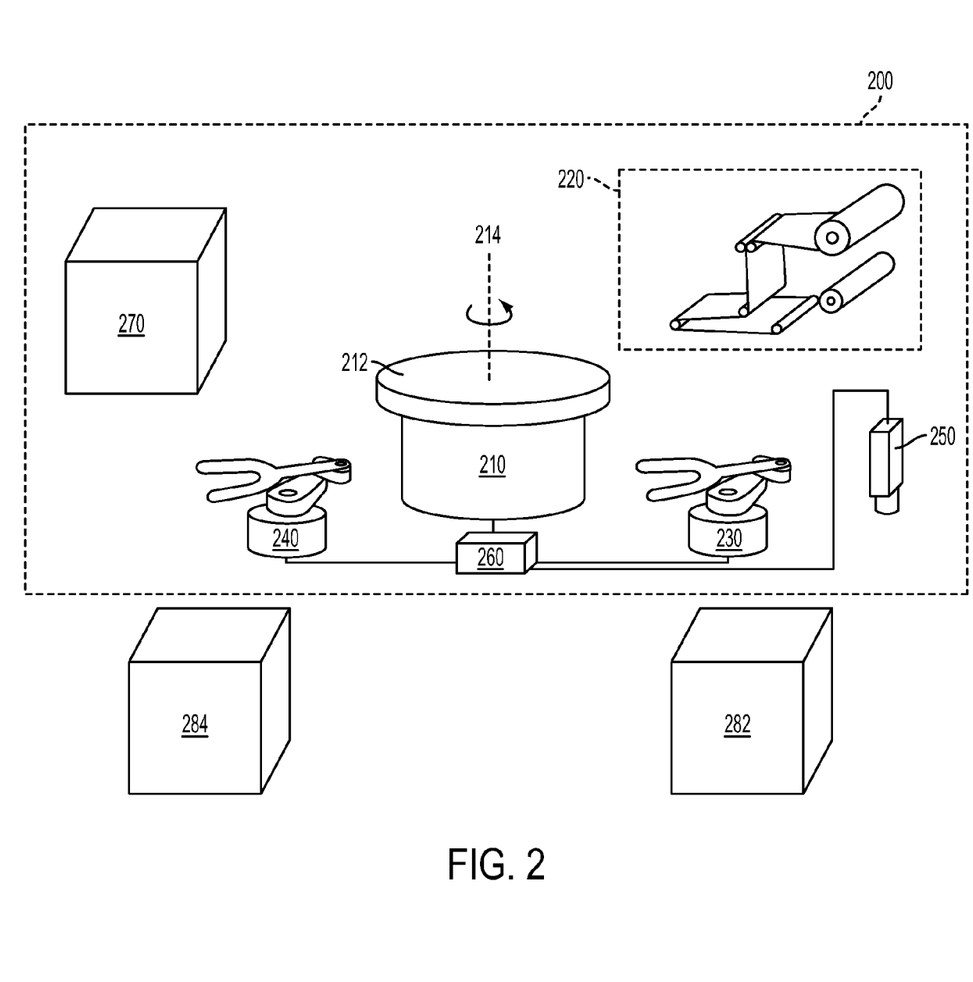
FIG. 2 is a system block diagram of an apparatus usable for separating a wafer from a carrier in accordance with one or more embodiments.

FIG. 2 is a system block diagram of an apparatus 200 usable for separating a wafer (such as wafer 110 in FIGS. 1A-1C) from a carrier (such as carrier 120 in FIGS. 1A-1B) in accordance with one or more embodiments.

The apparatus 200 includes a platform 210 having an upper surface 212, a tape feeding unit 220, robot arms 230 and 240, an alignment sensor 250, and a controller 260 electrically coupled to the platform 210, the tape feeding unit 220, the robot arms 230 and 240, and the alignment sensor 250. The apparatus 200 also includes a container 270 for storing ring shape frames (such as ring shape frame 142 in FIGS. 1B-1C). In some embodiments, the container 270 is placed outside the apparatus 200. In some embodiments, the container is a front opening universal pod (FOUP) that is suitable for being transported by a FOUP transportation system.

During operation of the apparatus 200, two other containers 282 and 284 are positioned within reach of either one or both of the robot arms 230 and 240. In some embodiments, the container 282 is usable to store wafer assemblies (such as wafer assembly 100 in FIG. 1A) to be processed for separating the wafer 110 from the carrier 120 of the wafer assembly 110 by the apparatus 200. In some embodiments, the container 284 is usable to store the wafer 110 after the wafer 110 is separated from the corresponding carrier 120. In some embodiments, the containers 282 and 284 are FOUPs.

In some embodiments, the robot arm 230 is configured to obtain the wafer assembly 100 from the container 282 outside the apparatus 200 and to place the wafer assembly 100 on the upper surface 212 of the platform 210. In some embodiments, the robot arm 230 is also configured to move the wafer assembly 100 to the alignment sensor 250. In some embodiments, the robot arm 240 is configured to move the ring shape frame 142 to the upper surface 212 of the platform 210. In some embodiments, the robot arm 240 is configured to move the wafer 110 to the container 284 after the wafer 110 is separated from the carrier 120. In some embodiments, one of the robot arms 230 and 240 is capable of moving various components among various units of the apparatus 200, and thus the other one of the robot arms 230 and 240 is omitted.

In some embodiments, the platform 210 is a chuck table capable of securing the carrier 120 on the upper surface 212 of the platform 210. In some embodiments, the chuck table secures the carrier 120 by a vacuum device or by an electrostatic device. In some embodiments, the platform 210 is rotatable about a rotational axis 214 of the platform 210. In at least one embodiment, the platform includes a heater that is usable to adjust a temperature at the upper surface 212 of the platform 210.

In some embodiments, the controller 260 controls the movement of the robot arms 230 and 240. In some embodiments, the controller 260, by using the alignment sensor 250, detects a wafer orientation of the wafer assembly 100 and positions, by controlling the robot arm 230 or 240, the wafer assembly 100 on the upper surface 212 of the platform 210 according to the detected wafer orientation. In some embodiments, the controller 260 controls the tape feeding unit 220 to mount a wafer frame 140 on the wafer 110. In some embodiments, the controller 260 controls the rotation of the platform 210. In some embodiments, the controller 260 controls the heater of the platform 210.

Figure 3:
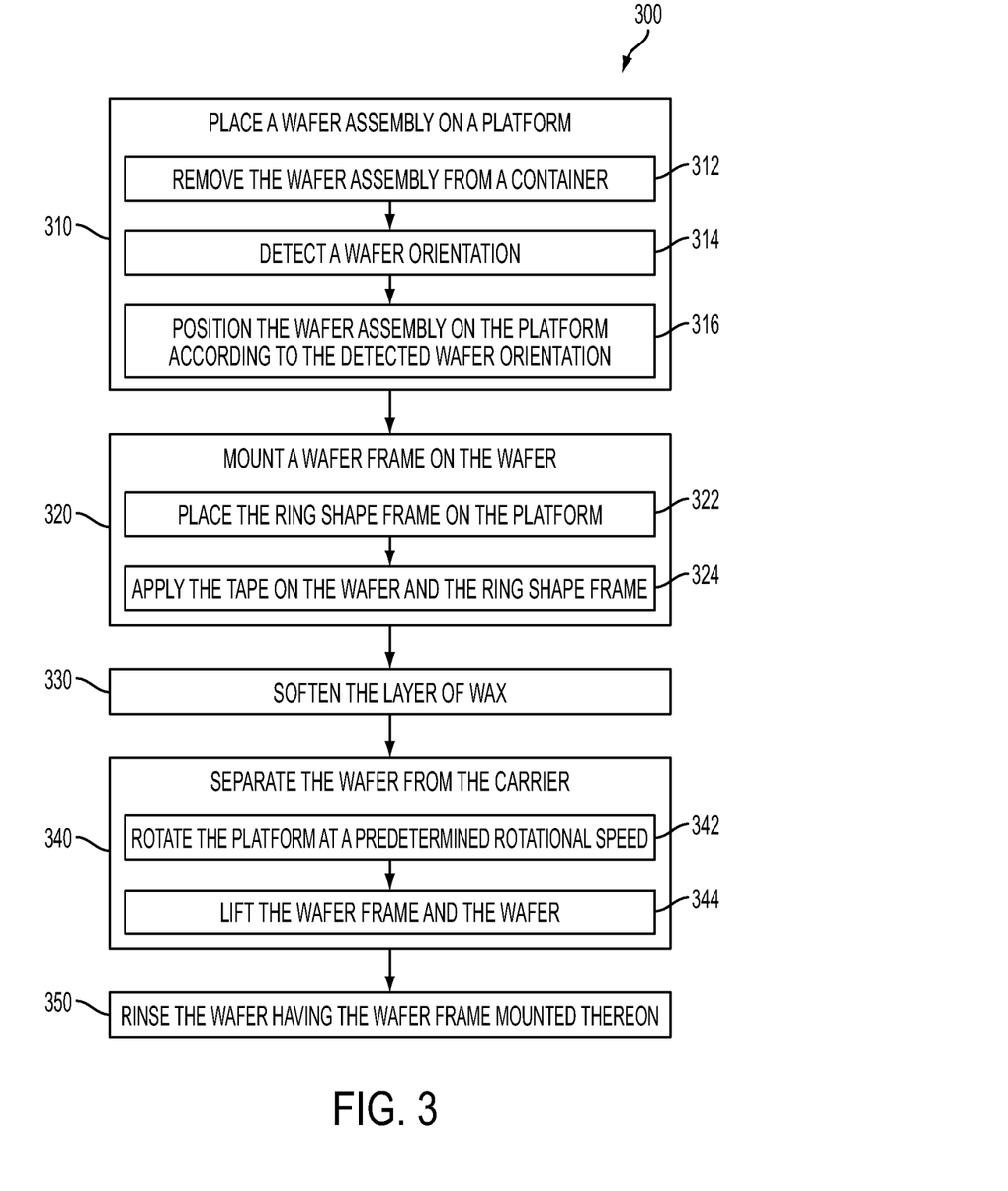
FIG. 3 is a flow chart of a method of separating a wafer from a carrier in accordance with one or more embodiments.

FIG. 3 is a flow chart of a method 300 of separating a wafer 110 (FIG. 1A) from a carrier 120 (FIG. 1A) in accordance with one or more embodiments. FIGS. 4A-4D are system block diagrams of the apparatus 200 at various operating stages in accordance with one or more embodiments. It is understood that additional processes may be performed before, during, and/or after the method 300 depicted in FIG. 3, and that some other processes may only be briefly described herein.

Figure 4A:
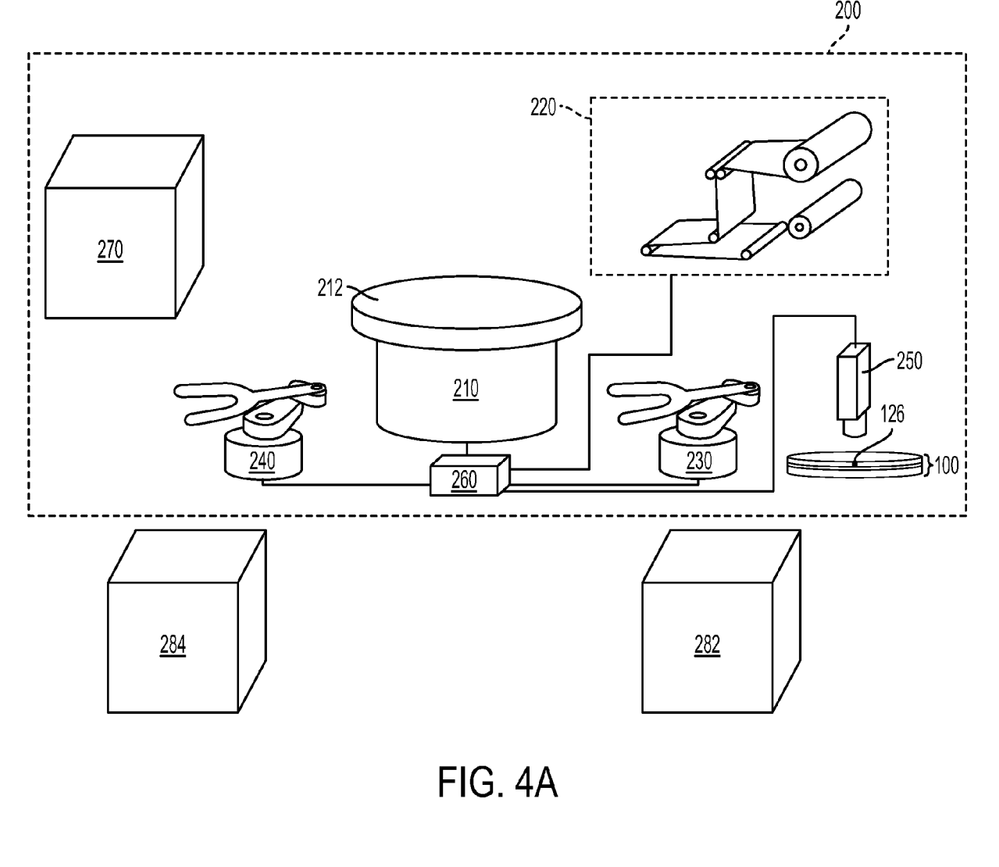
FIGS. 4A-4D are system block diagrams of an apparatus at various operating stages in accordance with one or more embodiments.

As depicted in FIG. 3, in operation 310, a wafer assembly 100 is placed on the upper surface 212 of the platform 210. In at least one embodiment, operation 310 includes operation 312, operation 314, and operation 316. As depicted in FIG. 3 and FIG. 4A, in operation 312, the wafer assembly 100 is removed from the container 282 by the robot arm 230. In operation 314, the robot arm 230 then transports the wafer assembly 100 to the alignment sensor 250. In at least one embodiment, the movement of the robot arm 120 is controlled by the controller 260.

In some embodiments, the detection of the wafer orientation of the wafer assembly 100 is performed by detecting a position of the cut mark 116 of the wafer 110 with regard to the position of the robot arm 230. In at least one embodiment, the detection of the movement of the wafer orientation is performed by the controller 260 in conjunction with the alignment sensor 250.

Figure 4B:
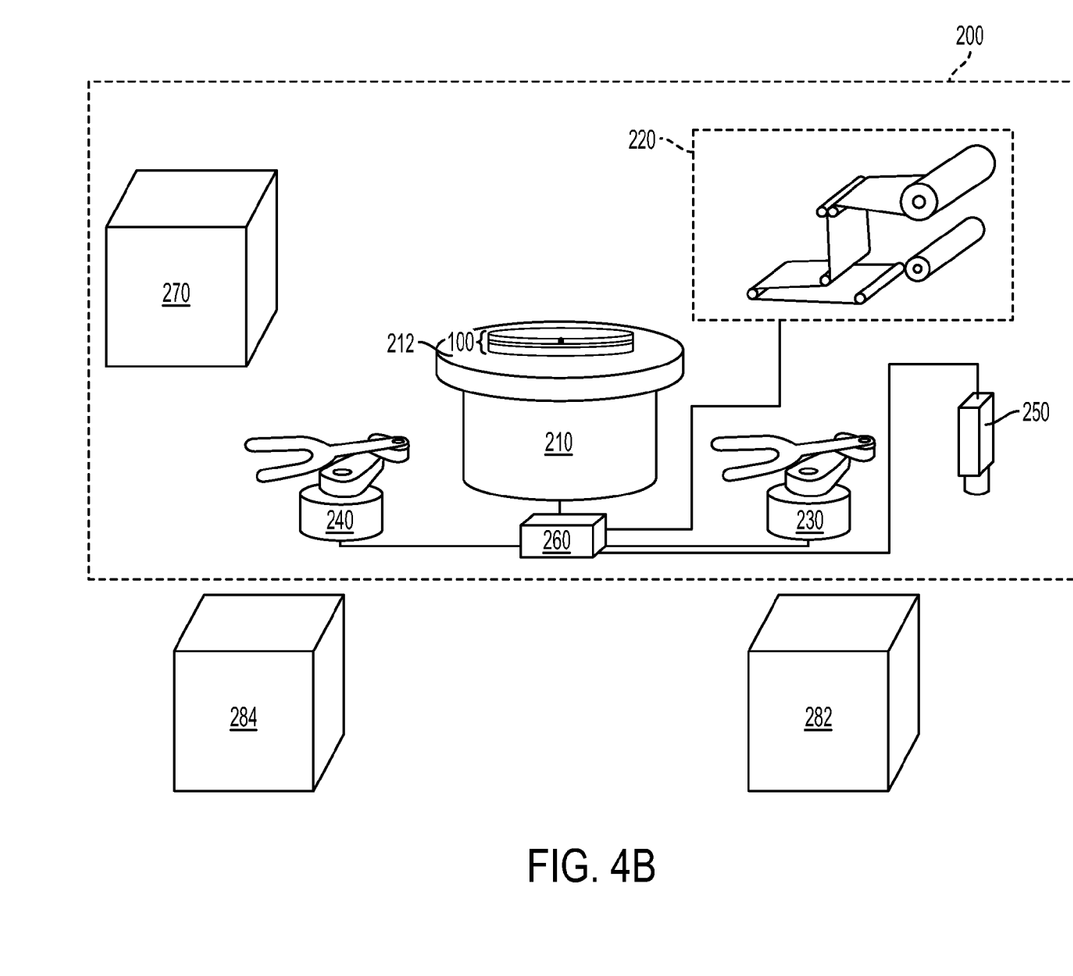

As depicted in FIG. 3 and FIG. 4B, in operation 316, the wafer assembly 100 is positioned onto the upper surface 212 of the platform 210 according to the detected wafer orientation. In at least one embodiment, the platform 210 is a chuck table having a vacuum device generating a suction force that pulls the wafer assembly 100 toward the upper surface 212 of the platform 210. In at least one embodiment, the platform is a chuck table having a electrostatic device generating a electrostatic force that pulls the wafer assembly 100 toward the upper surface 212 of the platform 210. In some embodiments, the wafer assembly 100 is secured on the platform 210 by the vacuum device or the electrostatic device. In some embodiments, the vacuum device or the electrostatic device is controlled by the controller 260.

Figure 4C:
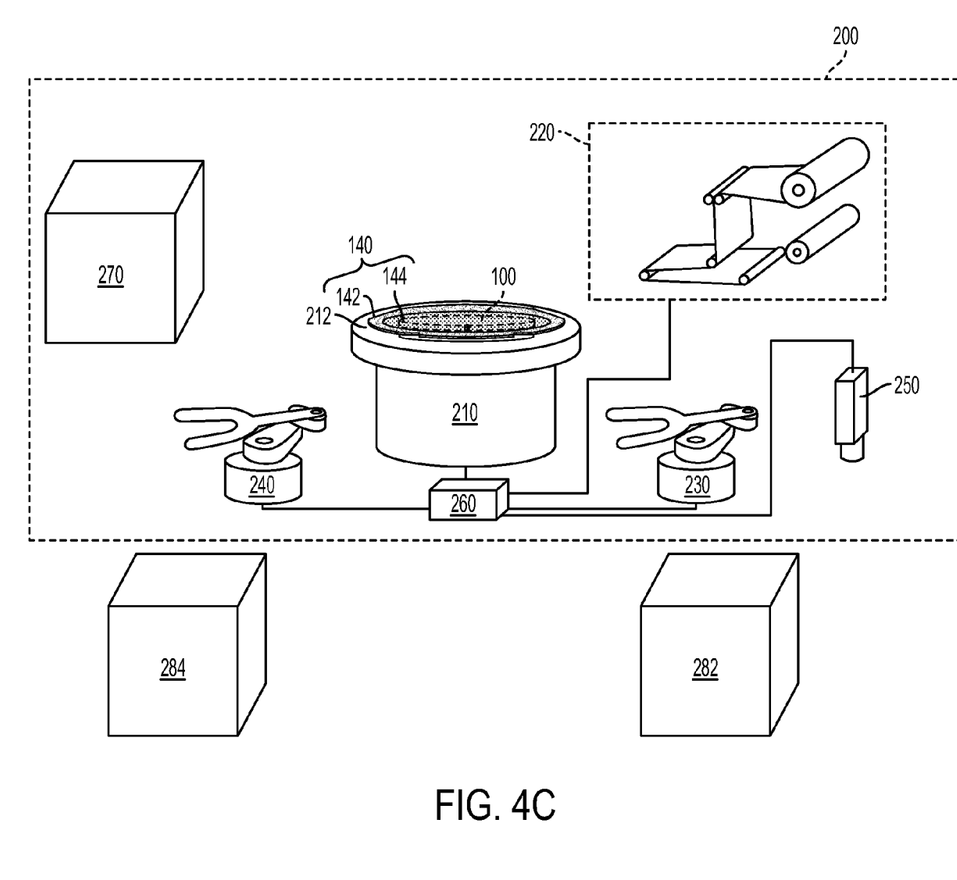

As depicted in FIG. 3 and FIG. 4C, in operation 320, a wafer frame 140 is mounted on the wafer 110 (FIG. 1B) of the wafer assembly 100. In at least one embodiment, operation 320 includes operation 322 and operation 324. In operation 322, a ring shape frame 142 is removed from the container 270 and placed on the platform 210. As depicted in FIG. 1B, the ring shape frame 142 having a hollow region 145 defined therein. Returning to FIG. 4C, the ring shape frame 142 is positioned such that the wafer assembly 100 is in the hollow region 145. As depicted in FIG. 3, in operation 324, a tape 144 is applied on an upper surface 112 (FIG. 1B) of the wafer 110 and on an upper surface 143 (FIG. 1B) of the ring shape frame 142. In some embodiments, the controller 260 drives the platform 210 to a position under the tape feeding unit 220 and controls the tape feeding unit 220 to apply the tape 144 on the ring shape frame 142 and the wafer assembly 100. In some embodiments, the controller 260 drives the tape feeding unit 220 to a position above the platform 210 and controls the tape feeding unit 220 to apply the tape 144 on the ring shape frame 142 and the wafer assembly 100.

As depicted in FIG. 3 and FIG. 4C, in operation 330, the layer of wax 130 (FIG. 1B) is softened. In some embodiments, the softening of the layer of wax 130 includes heating the upper surface 212 of the platform 210 to a temperature that is equal to or greater than a predetermined temperature. In some embodiments, the predetermined temperature is set to be sufficient to allow a wax material of the layer of wax 130 to transit into a liquid state having a viscosity coefficient equal to or less than a predetermined value. In some embodiments, the predetermined temperature ranges from 100° C. to 120° C.

Figure 4D:
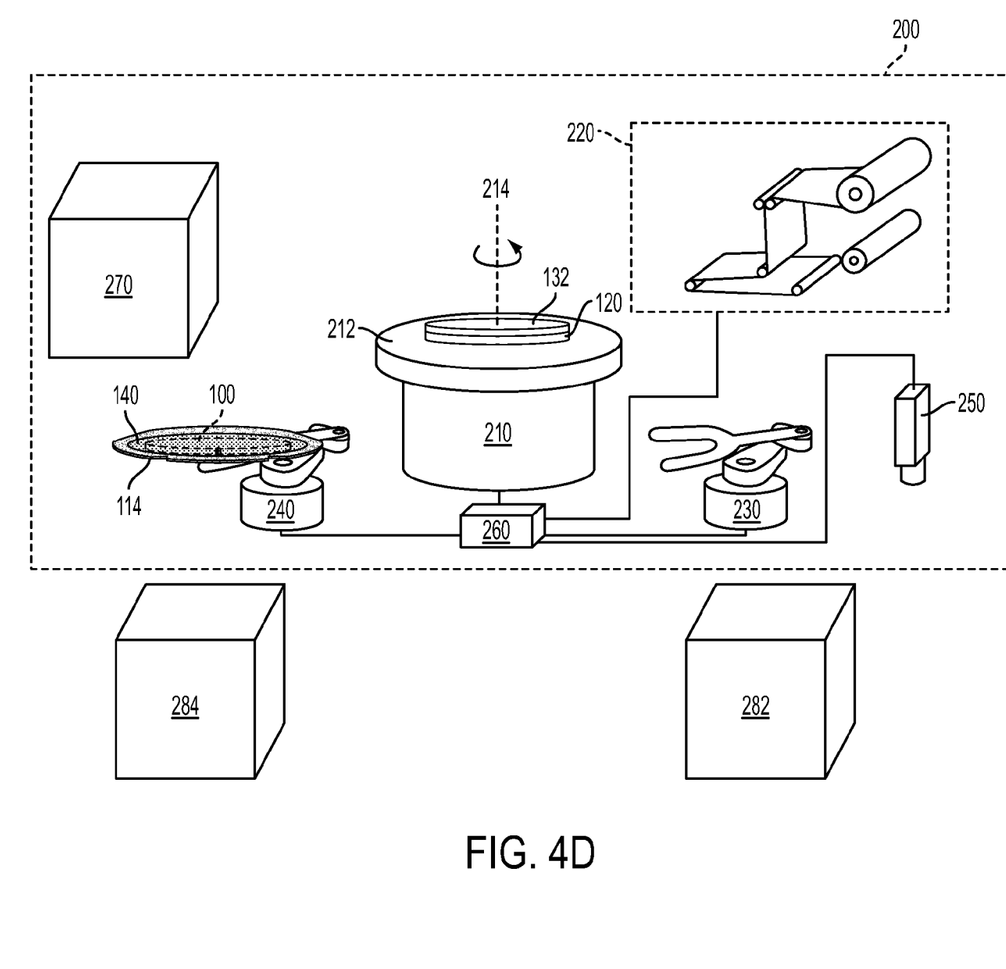

As depicted in FIG. 3 and FIG. 4D, in operation 340, the wafer 100 and the wafer frame 140 mounted thereon is separated from the carrier 120 by the robot arm 240. Operation 340 includes rotating the platform 210 (operation 342) and lifting the wafer frame 140 and the wafer 100 (operation 344). In at least one embodiment, the temperature at the upper surface 212 of the platform 210 is maintained equal to or greater than the predetermined temperature.

In operation 342, the platform 210 is controlled by the controller 260 to rotate at a predetermined rotational speed in order to facilitate the detachment of the wafer 110 from the carrier 120 by a torque generated by the rotation of the platform 210. In operation 344, the robot arm 240 is driven to lift the wafer frame 140. In some embodiments, the robot arm 240 is driven to cause a predetermined pressure at an interface between the wafer 110 and the layer of wax 130. In at least one embodiment, the robot arm 240 is driven to lift the wafer frame 140 at a predetermined speed.

In at least one embodiment, operation 342 and operation 344 are performed simultaneously. In some embodiment, operation 342 is omitted. In some embodiments, after the separation of the wafer 110 and the carrier 120, the wafer 100 and the wafer frame 140 mounted thereon are moved to the container 284. Also, after the separation of the wafer 110 and the carrier 120, a layer of wax residue 132 remains on the upper surface 122 (FIG. 1A) of the carrier 120. In some embodiments, a layer of wax residue (not shown) remains on the lower surface 114 of the wafer 110.

Returning to FIG. 3, in operation 350, the wafer 100 having the wafer frame 140 mounted thereon is rinsed to remove wax residue on the lower surface 114 of the wafer 110. In some embodiments, the wafer 110 and the wafer frame 140 mounted thereon are dipped in a wax-cleaning solution for a predetermined period of time. In some embodiments, the wax-cleaning solution comprises saponifier. In some embodiments, water or hot water is used to remove the wax residue instead of the wax-cleaning solution.

In accordance with some embodiments, an apparatus includes a platform having an upper surface, a tape feeding unit, a first robot arm, and a controller coupled to the platform, the tape feeding unit, and the first robot arm. The controller is configured to mount a wafer frame, by using the tape feeding unit, on a wafer of a wafer assembly on the upper surface of the platform. The wafer assembly includes the wafer, a carrier, and a layer of wax between the wafer and the carrier. The controller is also configured to heat the upper surface of the platform to a predetermined temperature and to separate, by the first robot arm, the wafer and the wafer frame mounted thereon from the carrier.

In accordance with some embodiments, an apparatus includes a platform having an upper surface, a tape feeding unit, a first robot arm, and a controller coupled to the platform, the tape feeding unit, and the first robot arm. The controller is configured to secure a carrier on the upper surface of the platform, the carrier being bonded to a wafer by a layer of wax between the wafer and the carrier. The controller is also configured to bind the wafer to a wafer frame using tape from the tape feeding unit, heat the wafer, carrier, and layer of wax to a predetermined temperature, and to separate, by the first robot arm, the wafer and the wafer frame from the carrier.

In accordance with some embodiments, an apparatus includes a platform having an upper surface, a tape feeding unit, a first robot arm, a second robot arm, and a controller coupled to the platform, the tape feeding unit, the first robot arm, and the second robot arm. The controller is configured to place, using the second robot arm, a wafer assembly on the upper surface of the platform. The wafer assembly includes a wafer, a carrier, and a layer of wax between the wafer and the carrier. The controller is also configured to mount a wafer frame, using the tape feeding unit, to the wafer, heat the upper surface of the platform to a predetermined temperature, and to separate, by the first robot arm, the wafer and the wafer frame mounted thereon from the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a platform having an upper surface;
   a tape feeding unit;
   a first robot arm; and
   a controller coupled to the platform, the tape feeding unit, and the first robot arm, the controller being configured to:
      mount a wafer frame, by using the tape feeding unit, on a wafer of a wafer assembly on the upper surface of the platform, the wafer assembly including the wafer, a carrier, and a layer of wax between the wafer and the carrier;
      heat the upper surface of the platform to a predetermined temperature;
      separate the wafer and the wafer frame mounted thereon from the carrier by simultaneously:
         controlling the platform to secure the carrier on the upper surface of the platform,
         driving the first robot arm to lift the wafer and the wafer frame, and
         continuing to heat the upper surface of the platform at a temperature equal to or greater than the predetermined temperature.

2. The apparatus of claim 1, further comprising:
   a second robot arm coupled to the controller, the second robot arm being configured to obtain the wafer assembly from outside the apparatus and to place the wafer assembly on the upper surface of the platform.

3. The apparatus of claim 2, further comprising:
   an alignment sensor coupled to the controller,
   the controller being further configured to detect a wafer orientation of the wafer assembly by the alignment sensor and position the wafer assembly on the upper surface of the platform by the second robot arm according to the detected wafer orientation.

4. The apparatus of claim 1, wherein the platform is rotatable, and the controller is further configured to cause the platform to rotate during a period that the first robot arm is driven to separate the wafer and the wafer frame mounted thereon from the carrier.

5. The apparatus of claim 1, wherein the platform is a chuck table configured to secure the carrier on the upper surface of the platform.

6. The apparatus of claim 1, wherein the controller is further configured to control the platform to rotate at a predetermined rotational speed.

7. The apparatus of claim 1, wherein the controller is further configured to drive the first robot arm to lift the wafer and the wafer frame at a predetermined speed.

8. The apparatus of claim 1, wherein the controller is further configured to move, by the first robot arm, the wafer frame to the upper surface of the platform.

9. The apparatus of claim 1, further comprising:
   an alignment sensor coupled to the controller,
   the controller being further configured to detect a wafer orientation of the wafer assembly by the alignment sensor and position the wafer assembly on the upper surface of the platform by the first robot arm according to the detected wafer orientation.

10. The apparatus of claim 1, wherein the controller is further configured to drive the platform to a position under the tape feeding unit.

11. The apparatus of claim 1, wherein the controller is further configured to drive the tape feeding unit to a position above the platform.

12. The apparatus of claim 1, wherein the predetermined temperature ranges from 100° C. to 120° C.

13. An apparatus, comprising:
    a platform having an upper surface;
    a tape feeding unit;
    a first robot arm; and
    a controller coupled to the platform, the tape feeding unit, and the first robot arm, the controller being configured to:
       secure a carrier on the upper surface of the platform, the carrier being bonded to a wafer by a layer of wax between the wafer and the carrier;
       bind the wafer to a wafer frame using tape from the tape feeding unit;
       heat the wafer, carrier, and layer of wax to a predetermined temperature of at least 100° C.; and
       separate the wafer and the wafer frame from the carrier by simultaneously:
          controlling the platform to continue to secure the carrier on the upper surface of the platform,
          driving the first robot arm to lift the wafer and the wafer frame, and
          continuing to heat the upper surface of the platform at a temperature equal to or greater than the predetermined temperature.

14. The apparatus of claim 13, wherein the platform comprises a heater.

15. The apparatus of claim 13, wherein the platform is a chuck table configured to secure the carrier on the upper surface of the platform by a vacuum device.

16. The apparatus of claim 13, wherein the platform is a chuck table configured to secure the carrier on the upper surface of the platform by an electrostatic device.

17. The apparatus of claim 13, wherein the platform is configured to be driven by the controller to a position under the tape feeding unit.

18. The apparatus of claim 13, wherein the tape feeding unit is configured to be driven by the controller to a position above the platform.

19. An apparatus, comprising:
    a platform having an upper surface;
    a tape feeding unit;
    a first robot arm;
    a second robot arm; and
    a controller coupled to the platform, the tape feeding unit, the first robot arm, and the second robot arm, the controller being configured to:
       place, using the second robot arm, a wafer assembly on the upper surface of the platform, the wafer assembly including a wafer, a carrier, and a layer of wax between the wafer and the carrier;
       mount a wafer frame, using the tape feeding unit, to the wafer;
       heat the upper surface of the platform to a predetermined temperature;
       separate the wafer and the wafer frame mounted thereon from the carrier by simultaneously:
          controlling the platform to secure the carrier on the upper surface of the platform,
          driving the first robot arm to lift the wafer and the wafer frame, and
          continuing to heat the upper surface of the platform at a temperature equal to or greater than the predetermined temperature.

20. The apparatus of claim 19, further comprising:
an alignment sensor coupled to the controller,
the controller being further configured to detect a wafer orientation of the wafer assembly by the alignment sensor and position the wafer assembly on the upper surface of the platform by the second robot arm according to the detected wafer orientation.

\* \* \* \* \*